United States Patent [19]

Garza

[11] Patent Number: 5,716,738
[45] Date of Patent: Feb. 10, 1998

[54] DARK RIMS FOR ATTENUATED PHASE SHIFT MASK

[75] Inventor: Cesar M. Garza, Plano, Tex.

[73] Assignee: Texas Instruments Incorporated, Dallas, Tex.

[21] Appl. No.: 660,294

[22] Filed: Jun. 7, 1996

Related U.S. Application Data

[60] Provisional application No. 60/000,392 Jun. 21, 1995.
[51] Int. Cl.⁶ .................................................... G03F 9/00
[52] U.S. Cl. ............................... 430/5; 430/322; 430/324
[58] Field of Search ............................. 430/5, 322, 324, 430/325, 326

[56] References Cited

U.S. PATENT DOCUMENTS 5,429,896  7/1995  Hasegawa et al. ........................ 430/5

*Primary Examiner*—S. Rosasco
*Attorney, Agent, or Firm*—Jacqueline J. Garner; W. James Brady, III; Richard L. Donaldson

[57] ABSTRACT

A mask for use in semiconductor fabrication which includes a light transparent substrate, preferably glass, having a border and light semitransparent material having light transmissivity preferably in the range of from about 6 to about 10 percent disposed thereon within the border. A light opaque layer which is sensitive to light and which can be patterned and have a predetermined portion thereof removed in response to selective exposure to light is disposed along substantially the entire border of the substrate. The mask can further include a region of light semitransparent material disposed around the border and under the light opaque layer. The light opaque layer is preferably a photosensitive polyimide.

19 Claims, 1 Drawing Sheet

DARK RIMS FOR ATTENUATED PHASE SHIFT MASK

This application claims the benefit of U.S. Provisional application No. 60/009392, filed Jun. 21, 1995.

BACKGROUND OF THE INVENTION

1. Field of the Invention

This invention relates to fabrication of masks for use in the fabrication of semiconductor devices.

2. Brief Description of the Prior Art

Optical microlithography is the technology of choice for the volume manufacture of semiconductor devices. This technology involves printing a pattern or relief image on a recording medium known as photoresist using a projection camera as the pattern exposing tool. These cameras, typically known as steppers, scanners or step and scanners, project a master pattern contained in a mask or reticle onto a wafer coated with the photoresist. Because the projected image is usually much smaller than the size of the wafer, the stage where the wafer sits is made to step to another location and another exposure then takes place. This process repeats until the whole usable wafer surface has been exposed, hence the name stepper. The latent image on the exposed wafer is developed in a suitable developer to produce the desired relief image. The mask or reticle is a piece of quartz on which the master pattern has been etched in an opaque material, such as chromium or other suitable material. The opaque material blocks the light whereas openings in the pattern are not blocked by the quartz. In this manner, light from the exposure tool only exposes the intended areas on the photoresist.

State-of-the-art processes in optical lithography are diffraction limited, i.e., the smallest features that can be printed are limited by the diffraction of the light as it passes through the openings in the reticle. A scheme has been proposed to circumvent this problem. By adding a transparent material of a thickness such that the light emerges at 180 degrees out of phase with neighboring features, the resultant interference effects improve the contrast of the aerial image, improving resolution and other process parameters. This technique, first proposed by Levenson et al. to improve resolution in optical lithography, is known as optical phase shift lithography. The scheme proposed by Levenson et al. is shown schematically in FIG. 2. By contrast, a schematic representation of a conventional reticle, also referred to as a "binary reticle", is shown in FIG. 1. The term "binary reticle" is used because only two possible light states exist (i.e. light or dark). In a phase shift reticle, on the other hand, several states are possible (i.e., dark, 0 degrees light, 180 degrees light or any step between 0 degrees and 180 degrees).

There are many schemes that can be used to shift the phase of the light in a reticle to produce the desired beneficial interference effect. The alternating phase shift approach is the scheme first proposed by Levenson et al. This scheme derives its name because the light in transparent regions must alternate in phase between 0 degrees and 180 degrees to produce the desired effect. Very significant improvement in resolution and process latitude have been shown with this technique. This approach, however, has two significant drawbacks. The first drawback is that though it is well suited for highly repetitive patterns, such as those encountered in a memory device, it is not well suited for random logic devices. The second drawback is that an alternating phase shift mask is much more difficult to fabricate than a conventional mask because the 0 degree shifted regions must be fabricated separately from the 180 degree shifted regions.

The attenuated phase shift techniques, particularly the embedded attenuated phase shift technique, best solve these problems. In the attenuated phase shift schemes, the chrome or dark regions on the mask have been modified in their chemical nature to allow a certain amount of light to pass or leak through. The transmission of these films is typically 10 percent or less. By adding to or subtracting from the transparent quartz areas so that the light is 180 degrees out of phase with the light leaking through, the desired interference effect can also be achieved. Furthermore, if the leaky film is of the proper thickness, the phase of the light leaking through can be made to be 180 degrees out of phase with respect to the quartz regions. This approach is known as "embedded phase shift" because the shifter is embedded in the leaky material, further simplifying the manufacturing process of attenuated pahse shift reticles. In summary, the advantages of the embedded attenuated phase shift shift approach are (a) it is applicable to any pattern, making it a suitable approach for the manufacture of random logic devices and (b) the mask fabrication process is greatly simplified. This is obvious from a comparison of the drawings shown in FIG. 1 (the conventional reticle) and FIG. 3 (the embedded attenuated phase shift reticle). They look the same except for the requirements that the opaque film has been modified to transmit the desired amount of light and thickness has been adjusted to shift the phase of the transmitted light 180 degrees.

Despite its advantages, there is a drawback with the practical use of attenuated phase shift reticles. The problem arises during the exposure process. Because the stage movement of any stepper has a finite accuracy, the edges of a chip on a wafer which has been previously exposed can become exposed a second time when the next chip is exposed. This problem can become even more severe on the corners of the chips where four exposures are possible. To avoid this problem, masking blades are used in conjunction with a dark chromium border on the reticle. The masking blades are programmed to be in a position whereby light does not expose neighboring chips. Since the masking blade positioning mechanism also has a limited accuracy, the width of the chrome border on the reticle has to be larger than the sum of the stage and masking blade inaccuracies. The problem with the attenuated phase shift approach arises from the fact that chromium normally used to block the light on the border now leaks a small amount of light. Therefore, the edges and particularly the corners of the chips can be overexposed.

SUMMARY OF THE INVENTION

In accordance with the present invention, there is provided a procedure wherein light is prevented from passing through the reticle at the border regions or edges of each die.

Briefly, there is provided a material which is printed over the reticle only at the border region or edges which is sufficiently opaque to block the light passing through the substrate at the substrate border region. The material is photosensitive in that it can be removed in conjunction with light illumination, inert to the procedures involved, tough in that it will resist scratches and adherent to the reticle material. Examples of such materials are polyimides or photosensitive polyimides which are well known, some of which are set forth in "A Photosensitive Polyimide Using an Alkaline Aqueous solution as a Developer" by Hiroshi Nishizawa et al., *Polymer Engineering and Science*, Mid-November 1992, Vol. 32, No 21, pp. 1610–1612, and a brochure of OCG Microelectronic Materials, Inc. Polyimide Technology Group, East Providence, R.I. dated February, 1995 which discusses their polyimide products Probimide 100, Proimide 7000 and Probimide 7500, the contents of both of which are incorporated herein in their entirety by reference.

Initially, a transparent substrate, preferably glass, is provided and a pattern of reticles is then deposited on the substrate in standard manner. Depending upon the pattern, the reticles are transparent or semitransparent in that the semitransparent reticles transmit from about 6 to about 10 percent of the light impinging thereon, this amount being predetermined and in accordance with the reticle composition. Those reticles that are opaque, are preferably formed of chromium and those reticles that are semitransparent are formed of a chromium alloy or molybdenum silicide with the degree of transmissivity being adjusted as noted above and as is well known in the art. Up to this point, the procedure is the same as in the prior art. A layer of a polymer of the type disclosed in the above noted publication of Nishizawa et al. is then coated on the substrate in the manner set forth in Nishizawa et al. and optionally over the reticles. The layer of polymer is then masked, exposed to light and then processed in standard manner to remove all of that layer except a region around the outer edge or border of the mask. The mask is now ready for use in standard manner with the problem of exposure in the border regions eliminated.

DESCRIPTION OF THE PREFERRED EMBODIMENT

Figure 1:
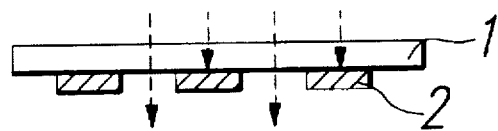
FIG. 1 is a schematic diagram of a conventional prior art binary reticle.

Referring first to FIG. 1, there is shown a conventional prior art alternating phase shift mask. The mask includes a substrate 1 which is typically a light transparent glass substrate 1 having a pattern 2 which is generally formed of chromium and which blocks the light.

Figure 2:
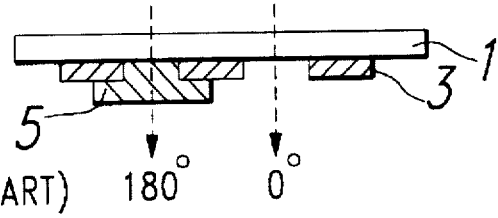
FIG. 2 is a schematic diagram of a conventional prior art phase shift mask.

FIG. 2 shows an alternating or Levenson-type phase shift mask which is the same as the mask of FIG. 1 except that it further includes a 180 degree phase shifter 5 which is disposed between alternating pairs of pattern features 3 to provide 180 degree phase shift to light passing therethrough in standard manner.

Figure 3:
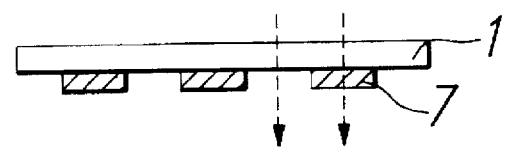
FIG. 3 is a schematic diagram of a conventional prior art leaky chrome phase shift mask.

Referring now to FIG. 3, there is shown a conventional prior art leaky chrome phase shift mask. In this mask, the substrate 1 is the same as in the prior art. However, some or all of the pattern features 7 transmit from about 6 to about 10 percent of the light impinging thereon, depending upon the particular alloy used, as is well known, and have a thickness sufficient to shift the phase of that portion of the light which passes therethrough by 180 degrees.

Figure 4A:
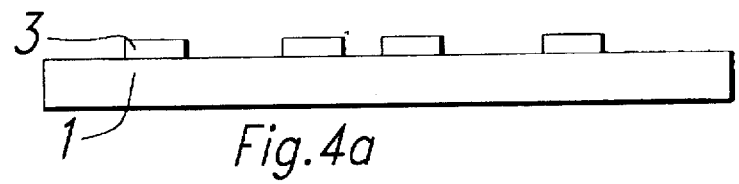
FIGS. 4a to 4c are a process flow showing a cross section of the mask structure in accordance with the present invention at various phases of the mask fabrication procedure.
Figure 4B:
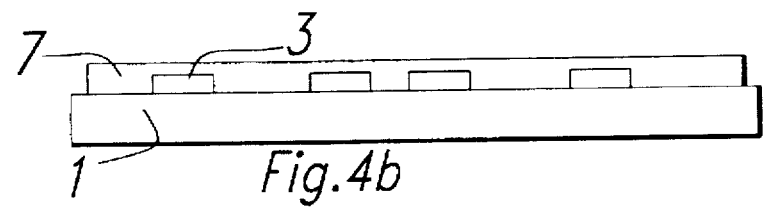
Figure 4C:
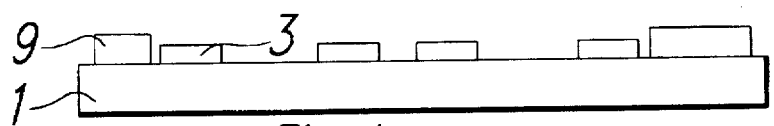

Referring now to FIGS. 4a to 4c, there is shown the mask structure of the present invention at different levels of the fabrication procedure therefor. Initially, a transparent glass substrate 1 is provided and a pattern 3 is then deposited on the substrate in standard manner. Each of the pattern features 3 is semitransparent, transmitting from about 6 to about 10 percent of the light impinging thereon, this amount being predetermined and in accordance with the reticle composition. Those reticle features that are opaque are preferably formed of chromium and those reticles that are semitransparent are formed of a chromium alloy or molybdenum silicide with the degree of transmissivity being adjusted as noted above and as is well known in the art. Up to this point, the procedure is the same as in the prior art.

Figure 5:
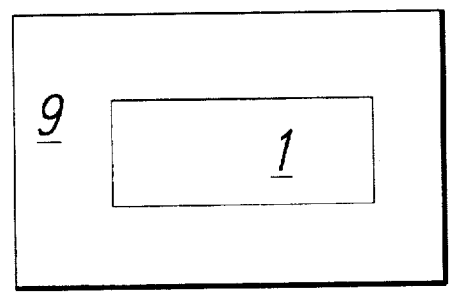
FIG. 5 is a top view of a completed mask in accordance with the present invention.

A layer of a polymer 7 of the type disclosed in the above noted publication of Nishizawa et al. was coated on the substrate 1 as set forth in Nishizawa et al. and optionally over the reticles 3 as shown in FIG. 4b. The layer 7 was then masked, exposed to light and then processed to remove all of the layer 7 except a region 9 around the outer edge or border of the mask for each chip on the wafer as shown in FIG. 4c. A top view of a mask for a chip with the opaque border region 9 is shown in FIG. 5. The mask is now ready for use in standard manner with the problem of exposure in the border regions eliminated.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modification.

I claim:

1. A mask for use in semiconductor fabrication which comprises:

(a) a light transparent substrate having a border and light semitransparent material disposed thereon within said border; and (b) a layer of light opaque material which is sensitive to light and which can be patterned and selectively removed in response to light, said layer being disposed along substantially the entire said border.

2. The mask of claim 1 further including a region of light semitransparent material disposed around said border, said light opaque layer disposed over said region of light semitransparent material.

3. The mask of claim 2 wherein said light semitransparent material has a light transmissivity of from about 6 to about 10 percent.

4. The mask of claim 3 wherein said light opaque layer is a photosensitive polyimide.

5. The mask of claim 4 wherein said substrate is transparent glass.

6. The mask of claim 4 wherein said light opaque layer is sufficiently opaque to block the light passing through the substrate at the substrate border region, photosensitive in that it can be removed in conjunction with light illumination, inert to the procedures involved, tough in that it will resist scratches and adherent to the reticle material.

7. The mask of claim 4 wherein said light opaque layer is one of a polyimide or a light-sensitive polyimide.

8. The mask of claim 3 wherein said light opaque layer is sufficiently opaque to block the light passing through the substrate at the substrate border region, photosensitive in that it can be removed in conjunction with light illumination, inert to the procedures involved, tough in that it will resist scratches and adherent to the reticle material.

9. The mask of claim 3 wherein said light opaque layer is one of a polyimide or a light-sensitive polyimide.

10. The mask of claim 2 wherein said light opaque layer is a photosensitive polyimide.

11. The mask of claim 2 wherein said light opaque layer is sufficiently opaque to block the light passing through the substrate at the substrate border region, photosensitive in that it can be removed in conjunction with light illumination, inert to the procedures involved, tough in that it will resist scratches and adherent to the reticle material.

12. The mask of claim 1 wherein said light semitransparent material has a light transmissivity of from about 6 to about 10 percent.

13. The mask of claim 12 wherein said light opaque layer is a photosensitive polyimide.

14. The mask of claim 12 wherein said light opaque layer is one of a polyimide or a light-sensitive polyimide.

15. The mask of claim 1 wherein said light opaque layer is a photosensitive polyimide.

16. The mask of claim 1 wherein said substrate is transparent glass.

17. The mask of claim 1 wherein said light opaque layer is sufficiently opaque to block the light passing through the substrate at the substrate border region, photosensitive in that it can be removed in conjunction with light illumination, inert to the procedures involved, tough in that it will resist scratches and adherent to the reticle material.

18. The mask of claim 1 wherein said light opaque layer is one of a polyimide or a light-sensitive polyimide.

19. A reticle for semiconductor processing, comprising:

a transparent substrate;

a semitransparent pattern disposed over said transparent substrate; and a layer of photosensitive opaque material disposed at a border region of said transparent substrate.

* * * * *